(12) United States Patent
Hayes

(10) Patent No.: US 8,133,752 B2
(45) Date of Patent: Mar. 13, 2012

(54) SOLAR CELLS WHICH INCLUDE THE USE OF CERTAIN POLY(VINYL BUTYRAL)/FILM BILAYER ENCAPSULANT LAYERS WITH A LOW BLOCKING TENDENCY AND A SIMPLIFIED PROCESS TO PRODUCE THEREOF

(75) Inventor: Richard Allen Hayes, Beaumont, TX (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 309 days.

(21) Appl. No.: 12/625,779

(22) Filed: Nov. 25, 2009

(65) Prior Publication Data

US 2010/0065109 A1    Mar. 18, 2010

Related U.S. Application Data

(62) Division of application No. 11/633,256, filed on Dec. 4, 2006.

(51) Int. Cl.
*H01L 31/0203* (2006.01)

(52) U.S. Cl. .................. 438/64; 257/E31.117

(58) Field of Classification Search .............. 438/64, 438/66, 67; 136/243, 258, 260, 263, 264; 257/292, 293, E31.117, E31.118, E31.119
See application file for complete search history.

(56) References Cited

U.S. PATENT DOCUMENTS

| | | | |
|---|---|---|---|
| 3,781,184 A | 12/1973 | Domicone et al. |
| 3,900,673 A | 8/1975 | Mattimoe et al. |
| 3,957,537 A | 5/1976 | Baskett et al. |
| 4,067,764 A | 1/1978 | Walker et al. |
| 4,072,779 A | 2/1978 | Knox et al. |
| 4,249,958 A | 2/1981 | Baudin et al. |
| 4,321,418 A | 3/1982 | Dran et al. |
| 4,469,743 A | 9/1984 | Hiss |
| 4,925,737 A | 5/1990 | Baba et al. |
| 5,356,745 A | 10/1994 | Sliemers et al. |
| 5,393,365 A | 2/1995 | Smith |
| 5,415,942 A | 5/1995 | Anderson |
| 5,482,571 A | 1/1996 | Yamada et al. |
| 5,501,910 A | 3/1996 | Smith |
| 5,508,205 A | 4/1996 | Dominguez et al. |
| 5,567,529 A | 10/1996 | Smith |
| 5,582,653 A | 12/1996 | Kataoka et al. |
| 5,631,089 A | 5/1997 | Center, Jr. et al. |

(Continued)

FOREIGN PATENT DOCUMENTS

EP    0 145 928 B1    11/1989

(Continued)

OTHER PUBLICATIONS

PCT International Search Report and Written Opinion for International application No. PCT/US2007/024834, dated May 14, 2008.

*Primary Examiner* — William D Coleman
*Assistant Examiner* — Daniel Shook
(74) *Attorney, Agent, or Firm* — Tong T. Li; Mark D. Kuller

(57) ABSTRACT

The present invention provides a solar cell laminate comprising a preformed bi-layer sheet having a poly(vinyl butyral) sub-layer.

31 Claims, 4 Drawing Sheets

U.S. PATENT DOCUMENTS

| | | | |
|---|---|---|---|
| 5,698,053 A | 12/1997 | Carroll et al. | |
| 5,728,230 A | 3/1998 | Komori et al. | |
| 5,965,853 A | 10/1999 | Hornsey | |
| 6,075,202 A | 6/2000 | Mori et al. | |
| 6,114,046 A | 9/2000 | Hanoka | |
| 6,204,443 B1 | 3/2001 | Kiso et al. | |
| 6,288,323 B1 | 9/2001 | Hayashi et al. | |
| 6,288,326 B1 | 9/2001 | Hayashi et al. | |
| 6,320,115 B1 * | 11/2001 | Kataoka et al. | 136/251 |
| 6,538,192 B1 | 3/2003 | Coster et al. | |
| 6,693,237 B2 | 2/2004 | Zenko et al. | |
| 6,777,610 B2 | 8/2004 | Yamada et al. | |
| 6,822,157 B2 | 11/2004 | Fujioka | |
| 6,940,008 B2 | 9/2005 | Shiotsuka et al. | |
| 7,189,457 B2 | 3/2007 | Anderson | |
| 2002/0061395 A1 | 5/2002 | Moran et al. | |
| 2002/0128412 A1 | 9/2002 | Kitahara et al. | |
| 2003/0051751 A1 | 3/2003 | Yamada et al. | |
| 2004/0144415 A1 | 7/2004 | Arhart | |
| 2004/0191422 A1 | 9/2004 | Kataoka et al. | |
| 2005/0077002 A1 | 4/2005 | Anderson et al. | |
| 2005/0129954 A1 | 6/2005 | Anderson | |
| 2005/0279401 A1 | 12/2005 | Arhart et al. | |
| 2005/0284516 A1 | 12/2005 | Koll | |
| 2006/0057392 A1 | 3/2006 | Smillie et al. | |
| 2006/0084763 A1 | 4/2006 | Arhart et al. | |
| 2006/0165929 A1 | 7/2006 | Lenges et al. | |
| 2007/0221268 A1 | 9/2007 | Hasch | |

FOREIGN PATENT DOCUMENTS

| | | |
|---|---|---|
| EP | 0 343 628 B1 | 12/1993 |
| EP | 0 631 328 B1 | 5/1998 |
| EP | 1 005 096 A2 | 5/2000 |
| EP | 1 054 456 A2 | 11/2000 |
| WO | 2008013837 A2 | 1/2008 |
| WO | 2008027190 A2 | 3/2008 |

* cited by examiner

SOLAR CELLS WHICH INCLUDE THE USE OF CERTAIN POLY(VINYL BUTYRAL)/FILM BILAYER ENCAPSULANT LAYERS WITH A LOW BLOCKING TENDENCY AND A SIMPLIFIED PROCESS TO PRODUCE THEREOF

This application claims the benefit of U.S. application Ser. No. 11/633,256, filed Dec. 4, 2006, the entire disclosure of which is incorporated herein by reference.

FIELD OF THE INVENTION

The present invention relates to solar cell modules comprising a non-blocking poly(vinyl butyral) containing bi-layer sheet.

BACKGROUND OF THE INVENTION

As a renewable energy resource, the use of solar cell modules is rapidly expanding. With increasingly complex solar cell modules or laminates, also referred to as photovoltaic modules, comes an increased demand for enhanced functional encapsulant materials. Photovoltaic (solar) cell modules or laminates are units that convert light energy into electrical energy. Typical or conventional construction of a solar cell laminate consists of at least 5 structural layers. The layers of a conventional solar cell module are constructed in the following order starting from the top, or incident layer (that is, the layer first contacted by light) and continuing to the backing (the layer furthest removed from the incident layer): (1) incident layer or front-sheet, (2) front-sheet (or first) encapsulant layer, (3) voltage-generating layer (or solar cell layer), (4) back-sheet (second) encapsulant layer, and (5) backing layer or back-sheet. The function of the incident layer is to provide a transparent protective window that will allow sunlight into the solar cell module. The incident layer is typically a glass plate or a thin polymeric film (such as a fluoropolymer or polyester film), but could conceivably be any material that is transparent to sunlight.

The encapsulant layers of solar cell laminates are designed to encapsulate and protect the fragile voltage-generating layer. Generally, a solar cell laminate will incorporate at least two encapsulant layers sandwiched around the solar cell layer. The optical properties of the front-sheet encapsulant layer must be such that light can be effectively transmitted to the solar cell layer. Over the years, a wide variety of polymeric films and sheets have been developed to produce laminated solar cell products. In general, these polymeric films and sheets must possess a combination of characteristics including very high optical clarity, low haze, high impact resistance, shock absorbance, excellent ultraviolet light resistance, good long term thermal stability, excellent adhesion to glass and other solar cell laminate layers, low ultraviolet light transmittance, low moisture absorption, high moisture resistance, excellent long term weatherability, among other requirements. Widely used encapsulant materials utilized currently include complex, multi-component compositions based on ethylene vinyl acetate (EVA), ionomer, poly(vinyl butyral) (PVB), polyurethane (PU), polyvinylchloride (PVC), metallocene-catalyzed linear low density polyethylenes, polyolefin block elastomers, ethylene acrylate ester copolymers, such as poly(ethylene-co-methyl acrylate) and poly(ethylene-co-butyl acrylate), acid copolymers, silicone elastomers, epoxy resins, and the like.

Ethylene vinyl acetate compositions, which have commonly been utilized as the encapsulant layer within solar cell modules, suffer the shortcomings of low adhesion to the other components used in the solar cell module, low creep resistance during the lamination process and end-use and low weathering and light stability. These shortcomings have generally been overcome through the formulation of adhesion primers, peroxide curing agents, and thermal and UV stabilizer packages into the ethylene vinyl acetate compositions, which necessarily complicates the sheet production and ensuing lamination processes.

Poly(vinyl butyral) compositions have also been commonly disclosed as encapsulant layers for solar cell modules. For example, Baskett, et. al., in U.S. Pat. No. 3,957,537, disclose the use of poly(vinyl butyral) as a hot melt adhesive in the production of solar cells. Further examples of the use of poly(vinyl butyral) in solar cell encapsulant layers include U.S. Pat. Nos. 4,249,958; 4,321,418; 5,508,205; 5,582,653; 5,728,230; 6,075,202; 6,288,323; 6,288,326; 6,538,192; 6,777,610; 6,822,157; 6,940,008, U.S. Patent Application Nos. 2004/0191422 and 2005/0284516, European Patent Nos. EP 0 343 628; EP 0 631 328; EP 1 005 096; and EP 1 054 456.

However, due to the extreme softness and tackiness at ambient temperature, the use of poly(vinyl butyral) sheets within solar cell modules has been complicated by the need to refrigerate the poly(vinyl butyral) sheet during shipment and storage. In addition, plasticized poly(vinyl butyral) films, wherein the tackiness augments with rising temperature and the sliding property towards glass gets worse, have a tendency to impair processability and workability. In order to improve the tendency and to suppress the hygroscopy, the temperature of the working places must be maintained at about 20° C. In practice, when a plasticized poly(vinyl butyral) film is used as the intermediate layer between two sheets of glass, it is necessary to adopt a two-step bonding process to prepare the laminate (see e.g., European Patent No. EP 0 145 928, page 2, line 30).

Bi-layer laminates comprising a poly(vinyl butyral) sub-layer have been used in the glazing art and are commercially available under the trade name SentryGlas® SpallShield by the E. I. du Pont de Nemours and Company (DuPont), Wilmington, Del. These bi-layer laminates are generally applied directly to a glass surface to produce vandal and burglary resistant glass, more particularly to prevent spalling, which is the shower of razor-sharp glass pieces which occurs opposite the side of impact when a glass pane, especially a tempered glass pane, is broken. Glazings which include such structures are disclosed in, for example, U.S. Pat. Nos. 3,781,184; 3,900,673; 4,059,469; 4,072,779; 4,242,403; 4,469,743; 4,543,283; 4,832,782; 4,834,829; 4,925,737; 4,952,457; 5,028,287; 5,069,942; 5,082.515; 5,188,692; 5,250,146; 5,356,745; 5,393,365; 5,415,942; 5,501,910; 5,567,529; 5,631,089; 5,698,053; 5,763,089; 5,965,853, and U.S. Patent Application No. 2005/0129954.

The present invention provides a solar cell laminate comprising a preformed poly(vinyl butyral)/film bi-layer sheet and a simplified process for producing the same. By "preformed", it is meant that the two sub-layers of the bi-layer sheet have been laminated and bonded together to form a single unit prior to any further process involving the bi-layer sheet in the construction of a solar cell laminate structure. Specifically, during a conventional process, when poly(vinyl butyral) sheets are used as laminate layers, interleave layers, e.g., polyethylene or polypropylene film layers, are often used during the lamination process and then discarded as undesirable waste. In the present invention, however, the film sub-layer of the preformed bi-layer sheet serves as an interleave layer to the poly(vinyl butyral) sheet, and, instead of being discarded, the film sub-layer remains in the laminate providing additional function(s).

SUMMARY OF THE INVENTION

In one aspect, the present invention is a solar cell laminate comprising (i) a solar cell layer comprising one or a plurality of electronically interconnected solar cells and having a light-receiving side and a back side, and (ii) at least one preformed bi-layer sheet comprising a first sub-layer comprising a poly (vinyl butyral) and a second sub-layer comprising a metal or polymeric film, wherein the preformed bi-layer sheet is at either the light-receiving side or the back side of the solar cell laminate.

In one particular embodiment, the at least one preformed bi-layer sheet is laminated to the light-receiving side of the solar cell layer and serves as a front-sheet encapsulant layer, and the second sub-layer of the at least one preformed bi-layer sheet comprises the polymeric film.

In another embodiment, the solar cell laminate further comprises a back-sheet encapsulant layer laminated to the back side of the solar cell layer and it is preferred that the back-sheet encapsulant layer is also formed of a preformed bi-layer sheet, wherein the second sub-layer may be a metal or polymeric film.

In yet another embodiment, the at least one preformed bi-layer sheet is laminated to the back side of said solar cell layer and serves as a back-sheet encapsulant layer. And preferably, the solar cell laminate further comprises a front-sheet encapsulant layer laminated to the light-receiving side of the solar cell layer.

In yet another embodiment, the solar cell laminates may further comprising an incident layer, and/or a back-sheet, and/or additional encapsulant layers, wherein the additional encapsulant layers are included to bind the second sub-layer of the preformed bi-layer sheet with other laminate layers.

In another aspect, the present invention is a process of manufacturing a solar cell laminate comprising: (i) providing an assembly comprising, from top to bottom, a front-sheet encapsulant layer, a solar cell layer comprising one or a plurality of electronically interconnected solar cells, and a back-sheet encapsulant layer, and (ii) laminating the assembly to form the solar cell module, wherein at least one of the two encapsulant layers is formed of a preformed bi-layer sheet comprising a first sub-layer comprising a poly(vinyl butyral) and a second sub-layer comprising a metal or polymeric film. Preferably, the lamination is conducted by subjecting the assembly to heat and pressure or vacuum.

In one particular embodiment, the front-sheet encapsulant layer in the assembly is formed of the preformed bi-layer sheet with its first sub-layer in direct contact with the solar cell layer, and the assembly further comprises a back-sheet placed next to the back-sheet encapsulant layer opposite from the solar cell layer. The assembly may further comprise a second front-sheet encapsulant layer and an incident layer, wherein the incident layer is placed next to the second front-sheet encapsulant layer, which in turn is in direct contact with the second sub-layer of the preformed bi-layer sheet.

In yet another embodiment, the back-sheet encapsulant layer in the assembly is formed of the preformed bi-layer sheet with its first sub-layer in direct contact with the solar cell layer, and the assembly further comprises an incident layer placed next to the front-sheet encapsulant layer opposite from said solar cell layer. The assembly may further comprise a second back-sheet encapsulant layer and a back-sheet, wherein the back-sheet is placed next to said second back-sheet encapsulant layer, which in turn is in direct contact with the second sub-layer of said preformed bi-layer sheet.

In yet another embodiment, the front-sheet encapsulant layer in the assembly is formed of the preformed bi-layer sheet with its second sub-layer in a closer proximity to the solar cell layer, and the assembly further comprises an incident layer, a second front-sheet encapsulant layer, and a back-sheet, wherein the incident layer is placed next to the first sub-layer of the preformed bi-layer sheet, which in turn has its second sub-layer in direct contact with the second front-sheet encapsulant layer, and which in turn is in direct contact with the solar cell layer; and wherein the back-sheet is placed next to the back-sheet encapsulant layer opposite from said solar cell layer.

In yet another embodiment, the back-sheet encapsulant layer in the assembly is formed of the preformed bi-layer sheet with its second sub-layer in a closer proximity to the solar cell layer, and the assembly further comprises an incident layer, a second back-sheet encapsulant layer, and a back-sheet, wherein the incident layer is placed next to the front-sheet encapsulant layer opposite from the solar cell layer, and wherein the back-sheet is placed next to the first sub-layer of the preformed bi-layer sheet, which in turn has its second sub-layer in direct contact with the second back-sheet encapsulant layer, and which in turn is in direct contact with the solar cell layer.

DETAILED DESCRIPTION OF THE INVENTION

To the extent permitted by the United States law, all publications, patent applications, patents, and other references mentioned herein are incorporated by reference in their entirety.

The materials, methods, and examples herein are illustrative only and the scope of the present invention should be judged only by the claims.

Definitions

The following definitions apply to the terms as used throughout this specification, unless otherwise limited in specific instances.

Unless stated otherwise, all percentages, parts, ratios, etc., are by weight.

When the term "about" is used in describing a value or an end-point of a range, the disclosure should be understood to include the specific value or end-point referred to.

In the present application, the terms "sheet" and "film" are used in their broad sense interchangeably.

In describing and/or claiming this invention, the term "copolymer" is used to refer to polymers containing two or more monomers.

When a first film or sheet is said to be "laminated to" a second film or sheet, it is meant that the first film or sheet is laminated to the second film or sheet directly or indirectly. By directly, it is meant the first film or sheet is in direct contact with and adhered to the second film or sheet. By indirectly, it is meant that the first film or sheet is not in direct contact with the second film or sheet, rather, it is bonded to the second film or sheet by at least one additional layer of film or sheet that is placed in between.

Bi-Layer Sheets

Figure 1:
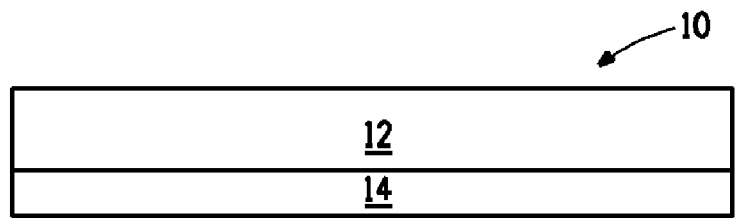
FIG. 1 is a cross-sectional view of a preformed bi-layer sheet 10 disclosed herein. The preformed bi-layer sheet 10 comprises a first sub-layer 12 and a second sub-layer 14, wherein the first sub-layer 12 comprises a poly(vinyl butyral) and the second sub-layer 14 is formed of a metal or polymeric film.

Now referring to FIG. 1, the present invention relates to the use of at least one preformed bi-layer sheet 10 in a solar cell module or laminate. The preformed bi-layer sheet 10 has a first sub-layer 12 derived from a poly(vinyl butyral) sheet and a second sub-layer 14 derived from a metal or polymeric film.

I. Poly(vinyl butyral) Sheets

In accordance to the present invention, the poly(vinyl butyral) sheets disclosed herein are derived from certain poly (vinyl butyral) compositions. The poly(vinyl butyral) used herein may be produced by aqueous or solvent acetalization. In a solvent process, acetalization is carried out in the presence of sufficient solvent to dissolve the poly(vinyl butyral) and produce a homogeneous solution at the end of acetalization. The poly(vinyl butyral) is separated from solution by precipitation of solid particles with water, which are then washed and dried. Solvents used are lower aliphatic alcohols such as ethanol. In an aqueous process, acetalization is carried out by adding butyraldehyde to a water solution of poly (vinyl alcohol) at a temperature of about 20° C. to about 100° C., in the presence of an acid catalyst, agitating the mixture to cause an intermediate poly(vinyl butyral) to precipitate in finely divided form and continuing the agitation while heating until the reaction mixture has proceeded to the desired end point, followed by neutralization of the catalyst, separation, stabilization and drying of the poly(vinyl butyral) resin. For example, poly(vinyl butyral) resin can be produced as disclosed within U.S. Pat. Nos. 3,153,009 and 4,696,971.

The poly(vinyl butyral) used herein will typically have a weight average molecular weight from about 30,000 to about 600,000, or preferably, from about 45,000 to about 300,000, or more preferably, from about 200,000 to 300,000, as measured by size exclusion chromatography using low angle laser light scattering. Poly(vinyl butyral) compositions used herein may comprise, on a weight basis, about 12% to about 23%, or preferably, about 14% to about 21%, or more preferably, about 15% to about 19.5%, or most preferably, about 15% to about 19%, of hydroxyl groups calculated as polyvinyl alcohol (PVOH). The hydroxyl number can be determined according to standard methods, such as ASTM D1396-92. In addition, the poly(vinyl butyral) compositions used herein may include 0 to about 10%, or preferably, 0 to about 3%, of residual ester groups, calculated as polyvinyl ester, typically acetate groups, with the balance being butyraldehyde acetal. The poly(vinyl butyral) composition may also contain a minor amount of acetal groups other than butyral, e.g., 2-ethyl hexanal, as disclosed within U.S. Pat. No. 5,137,954.

The poly(vinyl butyral) composition used herein typically contains a plasticizer and the amount depends on the specific poly(vinyl butyral) resin and the properties desired in the application. The plasticizer provides enhanced flexibility and processability of the poly(vinyl butyral) composition. Suitable plasticizers are commonly known within the art, e.g., as disclosed in U.S. Pat. Nos. 3,841,890; 4,144,217; 4,276,351; 4,335,036; 4,902,464; 5,013,779 and PCT Patent Application No. WO 96/28504. Plasticizers commonly employed are esters of a polybasic acid or a polyhydric alcohol. Preferred plasticizers include, but are not limited to, diesters obtained by the reaction of triethylene glycol or tetraethylene glycol with aliphatic carboxylic acids having from 6 to 10 carbon atoms; diesters obtained from the reaction of sebacic acid with aliphatic alcohols having from 1 to 18 carbon atoms; oligoethylene glycol di-2-ethylhexanoate; tetraethylene glycol di-n-heptanoate; dihexyl adipate; dioctyl adipate; mixtures of heptyl and nonyl adipates; dibutyl sebacate; tributoxyethylphosphate; isodecylphenylphosphate; triisopropylphosphite; polymeric plasticizers, such as, the oil-modified sebacic alkyds; mixtures of phosphates and adipates; mixtures of adipates and alkyl benzyl phthalates; and mixtures thereof. More preferred plasticizers include triethylene glycol di-2-ethylhexanoate, tetraethylene glycol di-n-heptanoate, dibutyl sebacate, and mixtures thereof. A single plasticizer can be used or a mixture of plasticizers can be used. For convenience, when describing the compositions of the present invention, a mixture of plasticizers can also be referred to herein as "plasticizer". That is, the singular form of the word "plasticizer" as used herein may represent the use of either one plasticizer or the use of a mixture of two or more plasticizers.

As described above, the plasticizer provides flexibility and processability to the poly(vinyl butyral) composition. Preferably, the poly(vinyl butyral) compositions used herein incorporate about 15 to about 60 wt %, or more preferably, about 15 to about 50 wt %, or most preferably, about 25 to about 40 wt %, of a plasticizer based on the total weight of the poly (vinyl butyral) composition.

The poly(vinyl butyral) compositions used herein also include acoustic poly(vinyl butyral) resins having, e.g., a single plasticizer in the amount in the range of from about 28 to about 40 wt %. Suitable acoustic poly(vinyl butyral) compositions are disclosed in PCT Patent Application No. WO 2004/039581.

An adhesion control additive for, e.g., controlling the adhesive bond between the poly(vinyl butyral) sub-layer and other component layers in the solar cell laminates, may also be used. These are generally alkali metal or alkaline earth metal salts of organic and inorganic acids. Preferably, they are alkali metal or alkaline earth metal salts of organic carboxylic acids having from 2 to 16 carbon atoms. More preferably, they are magnesium or potassium salts of organic carboxylic acids having from 2 to 16 carbon atoms. Specific examples of the adhesion control additives used herein include, e.g., potassium acetate, potassium formate, potassium propanoate, potassium butanoate, potassium pentanoate, potassium hexanoate, potassium 2-ethylbutylate, potassium heptanoate, potassium octanoate, potassium 2-ethylhexanoate, magnesium acetate, magnesium formate, magnesium propanoate, magnesium butanoate, magnesium pentanoate, magnesium hexanoate, magnesium 2-ethylbutylate, magnesium heptanoate, magnesium octanoate, magnesium 2-ethylhexanoate and the like and mixtures thereof. The adhesion control additive is typically used in the range of about 0.001 to about 0.5 wt % based on the total weight of the polymeric sheet composition.

Surface tension controlling agents, such as Trans® 290 or Trans® 296 (available from the Trans-Chemco Company) or Q-23183® (available from the Dow Chemical Company) can be used in the poly(vinyl butyral) compositions used herein.

The poly(vinyl butyral) compositions used herein may also contain other additives known within the art. The additives may include, but are not limited to, plasticizers, processing aides, flow enhancing additives, lubricants, pigments, dyes, flame retardants, impact modifiers, nucleating agents to increase crystallinity, anti-blocking agents such as silica, thermal stabilizers, UV absorbers, UV stabilizers, dispersants, surfactants, chelating agents, coupling agents, adhesives, primers, reinforcement additives, such as glass fiber, fillers and the like. For example, typical colorants can include a bluing agent to reduce yellowing. Generally, additives that may reduce the optical clarity of the composition, such as reinforcement additives and fillers, are reserved for those sheets used as back-sheet encapsulant layers or back-sheets.

The poly(vinyl butyral) compositions used herein may further contain an effective amount of a thermal stabilizer. Thermal stabilizers are well-known in the art. Any known thermal stabilizer may find utility within the present invention. Preferable general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds which destroy peroxide, hydroxylamines, nitrones, thiosynergists, benzofuranones, indolinones, and the like and mixtures thereof. More preferably, the thermal stabilizer is a bis-phenolic antioxidant, which have been found to be surprisingly suitable for preparing low color poly(vinyl butyral), especially when used in combination with the triethylene glycol di-2-ethylhexanoate plasticizer. Suitable specific bis-phenolic antioxidants include 2,2'-ethylidenebis(4,6-di-t-butylphenol); 4,4'-butylidenebis(2-t-butyl-5-methylphenol); 2,2'-isobutylidenebis(6-t-butyl-4-methylphenol); and 2,2'-methylenebis(6-t-butyl-4-methylphenol). Bis-phenolic antioxidants are commercially available under the tradename of Anox® 29, Lowinox® 22M46, Lowinox® 44B25, and Lowinox® 22IB46, for example. The poly(vinyl butyral) compositions used herein preferably incorporate 0 to about 10.0 wt %, or more preferably, 0 to about 5.0 wt %, or most preferably, 0 to about 1.0 wt %, of thermal stabilizers, based on the total weight of the composition.

The poly(vinyl butyral) used herein may further contain an effective amount of UV absorbers. UV absorbers are well-know in the art. Any known UV absorber may find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The compositions used herein may include 0 to about 10.0 wt %, or preferably, 0 to about 5.0 wt %, or more preferably, 0 to about 1.0 wt %, of UV absorbers, based on the total weight of the composition.

The poly(vinyl butyral) compositions used herein may also incorporate an effective amount of hindered amine light stabilizers (HALS). Hindered amine light stabilizers are well-know in the art. Generally, HALS are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. The compositions used herein may contain 0 to about 10.0 wt %, or preferably, 0 to about 5.0 wt %, or 0 to about 1.0 wt %, of HALS, based on the total weight of the composition.

The poly(vinyl butyral) sheets used herein may be produced through any known process. Generally, the poly(vinyl butyral) sheets are produced through extrusion casting processes. The sheets may have smooth or roughened surfaces. Preferably, the poly(vinyl butyral) sheets used herein have roughened surfaces to facilitate de-airing during the lamination process.

Plasticized poly(vinyl butyral) sheets used herein may be formed by initially mixing the poly(vinyl butyral) resin composition with plasticizer and then extruding the formulation through a sheet-shaping die, i.e. forcing molten, plasticized poly(vinyl butyral) through a horizontally long, vertically narrow die opening substantially conforming in length and width to that of the sheet being formed. The plasticized poly (vinyl butyral) compositions can generally be extruded at a temperature of from about 225° C. to about 245° C. Rough surfaces on one or both sides of the extruding sheet are preferably provided by the design of the die opening and the temperature of the die exit surfaces through which the extrudate passes, as disclosed in, e.g., U.S. Pat. No. 4,281,980. Alternative techniques for producing a preferable rough surface on an extruding poly(vinyl butyral) sheet involve the specification and control of one or more of polymer molecular weight distribution, water content and melt temperature. The sheet formation of poly(vinyl butyral) is disclosed in U.S. Pat. Nos. 2,904,844; 2,909,810; 3,679,788; 3,994,654; 4,161,565; 4,230,771; 4,292,372; 4,297,262; 4,575,540; 5,151,234; 5,886,675 and European Patent No. EP 0 185 863. Alternatively, the sheet in the "as extruded" condition may be passed over a specially prepared surface of a die roll positioned in close proximity to the exit of the die which imparts the preferable surface characteristics to one side of the molten polymer. Thus, when the surface of such roll has minute peaks and valleys, sheet formed of polymer cast thereon will have a rough surface on the side which contacts the roll which generally conforms respectively to the valleys and peaks of the roll surface. Such die rolls are disclosed in, e.g., U.S. Pat. No. 4,035,549. A roughened sheet surface is preferred to simplify the lamination process and to provide superior solar cell laminates. It is understood that such rough surface is only temporary and particularly functions to facilitate de-airing during laminating and after which it is melted smooth from the elevated temperature and pressure associated with autoclaving and other lamination processes.

The thickness of the poly(vinyl butyral) sheet used herein may be any thickness desired for the solar cell laminate structure. Preferably, the poly(vinyl butyral) sheet has a thickness less than or equal to about 30 mils (0.76 mm), or more preferably, less than or equal to about 20 mils (0.51 mm), or most preferably, from about 10 mils (0.25 mm) to about 20 mils.

II. Film Layers

Besides the first sub-layer of a poly(vinyl butyral) sheet, the preformed bi-layer sheet disclosed herein further comprises a second sub-layer of a metal film, such as aluminum foil, or a polymeric film. Polymers suitable for the polymeric films include, but are not limited to, poly(ethylene terephthalate) (PET), polycarbonate, polypropylene, polyethylene, polypropylene, cyclic polyolefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymers and the like. Preferably, the film is selected from the group consisting of bi-axially oriented PET films, coated bi-axially oriented PET films, and fluoropolymer films, e.g., poly(vinyl fluoride) or poly(vinylidene fluoride) films, such as Tedlar® or Tefzel® films, which are commercial products of DuPont. More preferably, the film is selected from the group consisting of bi-axially oriented PET films and coated bi-axially oriented PET films.

In accordance to the present invention, one or both surfaces of the film layers may be treated to enhance the adhesion to the other laminate layers in the solar cell laminates. This treatment may take any form known within the art, including adhesives, primers, such as silanes, flame treatments, such as those disclosed within U.S. Pat. Nos. 2,632,921; 2,648,097; 2,683,894 and 2,704,382, plasma treatments, such as those disclosed within U.S. Pat. No. 4,732,814, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the polymeric film through vacuum sputtering as disclosed in U.S. Pat. No. 4,865,711. For example, U.S. Pat. No. 5,415,942 discloses a hydroxy-acrylic hydrosol primer coating that may serve as an adhesion-promoting primer for PET films.

Preferably, the adhesive or primer is a silane which incorporates an amine function. Specific examples of such materials include, but are not limited to, gamma-aminopropyltriethoxysilane, N-beta-(aminoethyl)-gamma-aminopropyltrimethoxysilane, and the like and mixtures thereof. Commercial examples of such materials include, e.g., A-1100® silane (from the Silquest Company, formerly from the Union Carbide Company, believed to be gamma-aminopropyltrimethoxysilane) and Z6020® silane (from the Dow Company).

More preferably, the polymeric film used herein includes a primer coating on one or both surfaces, more preferably both surfaces, comprising a coating of a polyallylamine-based primer. The polyallylamine-based primer and its application to a PET film is disclosed within U.S. Pat. Nos. 5,411,845; 5,770,312; 5,690,994; and 5,698,329. Generally, PET film is extruded and cast as a film by conventional methods, as described above, and the polyallylamine coating is applied to the PET film either before stretching or between the machine direction stretching and transverse direction stretching operations, and/or after the two stretching operations and heat setting in the tenter oven. It is preferable that the coating be applied before the transverse stretching operation so that the coated PET web is heated under restraint to a temperature of about 220° C. in the tenter oven in order to cure the polyallylamine to the PET film surface(s). Such materials are disclosed within, e.g., U.S. Patent Application No. 2005/0129954. In addition to this cured coating, an additional polyallylamine coating can be applied on it after the stretching and tenter oven heat setting in order to obtain a thicker overall coating.

The thickness of the film layer used here in the preformed bi-layer sheet is not critical and may be varied depending on the particular application. Generally, the thickness of the film layer may range from about 0.1 mils (0.003 mm) to about 10 mils (0.26 mm), more preferably, from about 1 mil to about 7 mils (0.18 mm).

The polymeric film used herein is preferably sufficiently stress-relieved and shrink-stable under the coating and lamination processes. Preferably, the polymeric film used herein is heat stabilized to provide low shrinkage characteristics when subjected to elevated temperatures (i.e. less than 2% shrinkage in both directions after 30 minutes at 150° C.), such as are seen through the lamination processes described below.

The film layer of the preformed bi-layer sheet disclosed herein may be coated if desired. For example, the coating may function as oxygen and moisture barrier coatings, such as the metal oxide coating disclosed within, e.g., U.S. Pat. Nos. 6,521,825 and 6,818,819 and European Patent No. EP 1 182 710.

The film layer used herein may also have a hard coat layer on one or both surfaces. It is particularly preferable that any film surface have a hard coat if it is to be utilized as an outside laminate surface. Any hard coat formulation known within the art may be utilized. Generally, the hard coat layers are formed from an UV curing resin. Any resin that is UV curable may be usable. Specific examples of materials for the UV curing resin include, e.g., oligomers, such as urethane oligomers, polyester oligomers, and epoxy oligomers that have two or more ethylenically double bonds, mono- or polyfunctional oligomers, such as, e.g., pentaerythritol tetraacrylate (PETA), pentaerythritol tetramethacrylate, and dipentaerythritol hexaacrylate (DPEHA), and the like and mixtures thereof. The UV curing resin generally consists of an oligomer, a photoinitiator, and, if desired, a reactive diluent (monomer). Specific examples of the photoinitiator includes, e.g., benzoin, benzophenone, benzoyl methyl ether, benzoin ethyl ether, benzoin isopropyl ether, benzoin isobutyl ether, dibenzyl, 5-nitroacenapthene, hexachlorocyclopentadiene, p-nitrodiphenyl, p-nitroaniline, 2,4,6-trinitroaniline, 1,2-benzanthraquinone, 3-methyl-1,3-diaza-1,9-benzanthrone, and the like and mixtures thereof. The level of the diluent is preferably within the range from about 0.1 to about 10 wt %, or more preferably, from about 0.5 to about 5 wt %, based on the total weight of the UV curable resin. The level of the photoinitiator is preferably less than or equal to about 5 wt % based on the total weight of the UV curable resin. The hard coat may be applied to the film through typical solution coating processes.

The hard coat may also incorporate further additives or be modified to provide other desirable attributes, such as a high scratch-resistance.

Generally, to enhance the scratch resistance of the hard coat layer, the pencil hardness must be increased. Preferably, the scratch-resistant hard coat layer should have a pencil hardness of 5H or greater, or more preferably, 8H or greater, or most preferably, 9H or greater. The hard coat may contain fine particles of $SiO_2$, $TiO_2$, $ZrO_2$, $Al_2O_3$ or MgO to improve the hardness and wear resistance. These particles are basically transparent and do not lower the transmittance of visible light by a film. An example of a scratch-resistant hard coat layer additive includes UVCH1105® resin that is commercially available from the Toshiba Silicone Corporation. Abrasion resistant polysiloxane and oligomeric hardcoat materials are disclosed in U.S. Patent Application No. 2005/0077002. Further examples of abrasion resistant useful herein include silica and organic silanol coatings that are disclosed within U.S. Pat. No. 4,177,315.

The hard coat layer may further incorporate fog-resistant additives to prevent dew condensation and the loss of film transparency thereby. This is especially important when a surface of the film forms an outside layer of the solar cell laminates of the present invention. Generally, to provide fog-resistance, hydrophilic oligomers and monomers or surfactants (especially wetting agents) are utilized. The fog-resistant hard coat layer may be formed using, e.g., DIABEAM® MH-3263 resin available from the Mitsubishi Rayon Co., Ltd.

The hard coat layer may further incorporate additives which provide high gloss, preferably a glass level of at least 95 (according to JIS K 7105) or greater. An example of the high gloss hard coat layer can be formed using, e.g., ADEKA OPTMER® KR-567 available from the ASAHI DENKA KOGYO K.K. Company.

The hard coat layer may further incorporate additives which provide high solvent resistance, especially excellent solvent resistance to highly polar solvents, such as N,N'-dimethylformamide. Generally, such solvent resistant hard coat compositions will include a hydrophobic additive, such as, e.g., a silicon- or fluorine-modified oligomers, monomers or resin. An example of a solvent resistant hard coat composition is, e.g., Silicone Hard Coat Agent® KP851 resin available from the Shin-Etsu Chemical Co., Ltd.

The hard coat layer may further incorporate additives which increase the moisture barrier properties of the film. Generally, such moisture barrier hard coat compositions may include a hydrophobic additive, such as, e.g., a silicon- or fluorine-modified oligomers, monomers or resin. An example of a moisture barrier hard coat composition is, e.g., Ultraviolet Curing Resin Having Low Permeability available from NIPPON KASEI Co., Ltd.

The films may further have modified surfaces. For example, the films may have coatings of antistatic materials. Examples of the antistatic agent include ionic polymer compounds, surfactants, conductive inorganic fine particles, inorganic electrolytes, organic complex salts, and the like. The term "ionic polymer compounds" is a general term for polymer compounds each having an ionic group in a main chain or side chain, or as a pendant of the main chain. Examples of ionic groups of polymer compounds each having an ionic group include, but are not limited to, anionic groups of sulfonates, carboxylates, phosphates, alkylsulfonate salts, alkylphosphate salts, and the like; cationic groups of compounds each mainly composed of a tertiary ammonium salt such as an alkyltrimethylammonium salt, lauryltrimethylammonium chloride, an alkylpyrrolidium salt, or the like; nonionic groups of compounds each mainly composed of a polyether, a polyhydric alcohol, a polyoxyethylene alkylamine, a polyoxyethylene fatty acid ester, or the like; long chain fatty acid groups; ampholyte ions of compounds each having tertiary ammonium nitrogen and a carboxyl group or sulfone group; and the like. Examples of a polymer compound having an ionic group in a main chain include polymer compounds each having a pyrrolidium ring, a piperidium ring, or the like in its main chain; and these polymer compounds each further containing, as a comonomer, a compound having an unsaturated bond. Examples of a polymer compound having an ionic group in its side chain include polymer compounds each having a main chain comprising a homopolymer of acrylic acid, methacrylic acid, styrene, or the like and/or a copolymer with another component such as a saturated hydrocarbon such as ethylene, propylene, or the like, an unsaturated hydrocarbon such as acetylene, or the like, or alkyleneoxide, and a side chain having an ionic group of a phosphate salt, a sulfonate salt, a vinylsulfonate salt, a carboxylate salt, a tertiary ammonium salt, or the like.

III. Preparation of the Preformed Bi-Layer Sheets

The processes to pre-form the bi-layer sheets disclosed herein may take many forms and may be produced through any known method. For example, the preformed bi-layer sheets may be produced through co-extrusion, whereby two or more slit dies are utilized, or by extrusion coating, for example, of the poly(vinyl butyral) sub-layer onto a preformed film layer.

Preferably, the preformed bi-layer sheets disclosed herein are produced through lamination of preformed poly(vinyl butyral) sheets with preformed film layers. For example, the poly(vinyl butyral) sheet may be lightly bonded to the film layer through a nip roll bonding process. In such a process, the film is supplied from a roll and first passes over a tension roll. The film may be subjected to moderate heating by passing through a heating zone, such as an oven. The poly(vinyl butyral) sheet may also be supplied from a roll or as flat sheet stock and first passes over a tension roll. The poly(vinyl butyral) sheet may be subjected to moderate heating by passing through a heating zone, such as an oven. Heating should be to a temperature sufficient to promote temporary fusion bonding, i.e., to cause the surfaces of the poly(vinyl butyral) sheet to become tacky. Suitable temperatures for a preferred poly(vinyl butyral) sheet is within the range of about 50° C. to about 120° C., with the preferred surface temperatures reaching about 65° C.

The film layer may be fed along with the poly(vinyl butyral) sheet through nip rolls where the two layers are merged together under moderate pressure to form a weakly bonded laminate. If desired, the nip rolls may be heated to promote the bonding process. The bonding pressure exerted by the nip rolls may vary with the film materials, the poly (vinyl butyral) materials and the temperatures employed. Generally the bonding pressure may be within the range of about 10 psi (0.7 kg/cm$^2$) to about 75 psi (5.3 kg/cm$^2$), or preferably, about 25 psi (1.8 kg/cm$^2$) to about 30 psi (2.1 kg/cm$^2$). The tension between the poly(vinyl butyral) sheet and the film layer is controlled by passage over an idler roll. Typical line speeds through the roll assembly are within the range of about 5 feet (1.5 m) to about 30 feet (9.2 m), per minute. Proper control of the speed and the tension tends to minimize wrinkling of the film. After bonding, the preformed bi-layer sheet is passed over a series of cooling rolls which ensure that the sheet taken up on a roll is not tacky. Water cooling is generally sufficient to achieve this objective. Tension within the system may be further maintained through the use of idler rolls. Sheets made through this process will have sufficient strength to allow handling by laminators who will produce the final solar cell laminates which incorporate these preformed bi-layer sheets.

Such preformed poly(vinyl butyral)/film bi-layer composite sheets are also commercially available under the trade name SentryGlas® SpallShield by DuPont. For example, SentryGlas® Spallshield 3010 is a bi-layer composite consisting of a 30 mil (0.76 mm) thick poly(vinyl butyral) sheet and a 10 mil (0.25 mm) thick polyester film layer; SentryGlas® Spallshield 1510 is a bi-layer composite consisting of a 15 mil (0.38 mm) thick poly(vinyl butyral) sheet and a 10 mil (0.25 mm) thick polyester film layer; and SentryGlas® Spallshield 307 is a bi-layer composite consisting of a 30 mil (0.76 mm) thick poly(vinyl butyral) sheet and a 7 mil (0.18 mm) thick polyester film layer.

Solar Cell Modules or Laminates

Solar cells are commonly available on an ever increasing variety as the technology evolves and is optimized. Within the present invention, a solar cell is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells due to relatively low cost manufacturing ease for large scale solar cells.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620. Examples of thin film solar cell modules are those that comprise cadmium telluride or CIGS, (Cu(In—Ga)(SeS)2), thin film cells.

Figure 2:
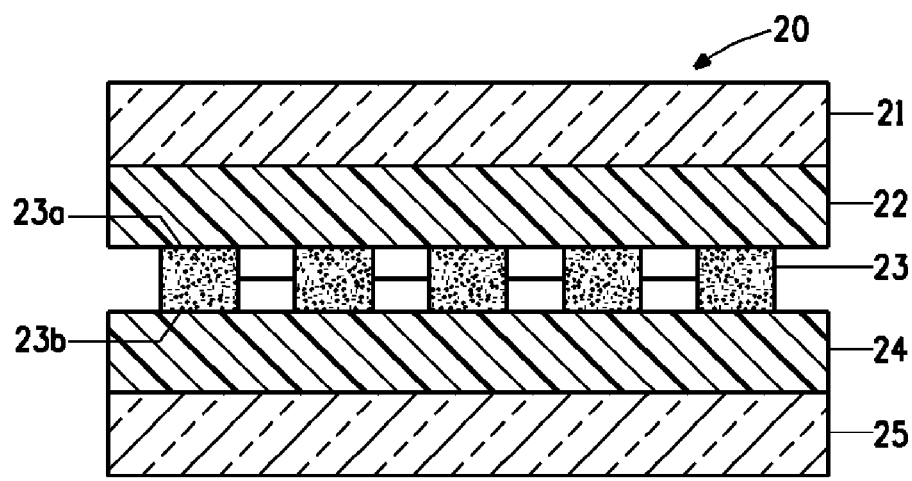
FIG. 2 is a cross-sectional view of a typical prior art solar cell module 20 comprising (i) an incident layer 21, (ii) a front-sheet encapsulant layer 22, (iii) a solar cell layer 23, (iv) a back-sheet encapsulant layer 24, and (v) a back-sheet 25.

Now referring to FIG. 2, a typical prior art solar cell laminate or module 20 consists of (i) a solar cell layer 23 that is formed of one or a plurality of electronically interconnected solar cells, (ii) one or more encapsulant layers laminated to either side of the solar cell layer, such as the front-sheet encapsulant layer 22 that is laminated to the light-receiving side 23a of the solar cell layer and the back-sheet encapsulant layer 24 that is laminated to the back side 23b of the solar cell layer, (iii) a first outer layer on the light-receiving side of the laminate, i.e., the incident layer 21; (iv) a second outer layer on the rear side of the laminate, i.e., the back-sheet 25; and (v) optionally other functional film or sheet layers embedded with the laminate, such as dielectric layers or barrier layer (e.g., moisture or oxygen barrier layers). It is essential that all the film or sheet layers laminated to the light-receiving side of the solar cell layer are made of transparent materials to allow efficient transmission of sunlight into the solar cell(s). In some instances, a special film or sheet layer may be included to serve both the function of an encapsulant layer and an outer layer, e.g., an incident layer or a back-sheet. It is also conceivable that any of the film or sheet layers included in the laminates may be formed of single- or multi-layer films or sheets.

In general, the encapsulant layer(s) of a solar cell laminate may be derived from any type of suitable films or sheets. Such suitable films or sheets include, but are not limited to, films or sheets comprising poly(vinyl butyral), ionomers, EVA, acoustic poly(vinyl acetal), acoustic poly(vinyl butyral), PU, PVC, metallocene-catalyzed linear low density polyethylenes, polyolefin block elastomers, ethylene acrylate ester copolymers, such as poly(ethylene-co-methyl acrylate) and poly(ethylene-co-butyl acrylate), acid copolymers, silicone elastomers and epoxy resins. The encapsulant layer(s) comprised in the solar cell laminates may have smooth or roughened surfaces. Preferably, the encapsulant layer(s) have roughened surfaces to facilitate the de-airing of the laminates through the laminate process.

The outer layers of the solar cell laminates, i.e., the incident layers and the back-sheets, may be derived from any suitable sheets or films. Suitable sheets used herein may be glass or plastic sheets, such as, polycarbonate, acrylics, polyacrylate, cyclic polyolefins, such as ethylene norbornene polymers, metallocene-catalyzed polystyrene, polyamides, polyesters, fluoropolymers and the like and combinations thereof, or metal sheets, such as aluminum, steel, galvanized steel, and ceramic plates.

Glass may serve as the incident layer of the solar cell laminate and the supportive back-sheet of the solar cell module may be derived from glass, rigid plastic sheets or metal sheets. The term "glass" is meant to include not only window glass, plate glass, silicate glass, sheet glass, low iron glass, tempered glass, tempered CeO-free glass, and float glass, but also includes colored glass, specialty glass which includes ingredients to control, for example, solar heating, coated glass with, for example, sputtered metals, such as silver or indium tin oxide, for solar control purposes, E-glass, Toroglass, Solex® glass (a product of Solutia) and the like. Such specialty glasses are disclosed in, for example, U.S. Pat. Nos. 4,615,989; 5,173,212; 5,264,286; 6,150,028; 6,340,646; 6,461,736; and 6,468,934. The type of glass to be selected for a particular laminate depends on the intended use.

The film layers used herein may be metal or polymeric. The specifics of these film layers are similar to those films used in the preformed bi-layer sheets, as described above.

The films used herein may serve as an incident layer (such as the fluoropolymer or PET film) or a back-sheet (such as the fluoropolymer, aluminum foil, or PET film).

The optional other functional film or sheet layers embedded with the laminate, such as the dielectric layers or barrier layers, may be derived from any of the above mentioned polymeric films that are coated with additional functional coatings. For example, PET films coated with a metal oxide coating, such as those disclosed within U.S. Pat. Nos. 6,521, 825 and 6,818,819 and European Patent No. EP 1 182 710, may function as oxygen and moisture barrier layers in the laminates.

If desired, a layer of non-woven glass fiber (scrim) may also be included in the solar cell laminates to facilitate de-airing during the lamination process or to serve as reinforcement for the encapsulant layer(s). The use of such scrim layers within solar cell laminates is disclosed within, for example, U.S. Pat. Nos. 5,583,057; 6,075,202; 6,204,443; 6,320,115; 6,323,416; and European Patent No. 0 769 818.

In accordance to the present invention, however, the solar cell laminate of the present invention comprises at least one layer of the preformed bi-layer sheet 10 (as shown in FIG. 1) serving as an encapsulant layer.

In one aspect, the solar cell laminate of the present invention comprises at least one layer of the preformed bi-layer sheet 10 which has the poly(vinyl butyral) sub-layer 12 in a closer proximity to the solar cell layer.

Figure 3:
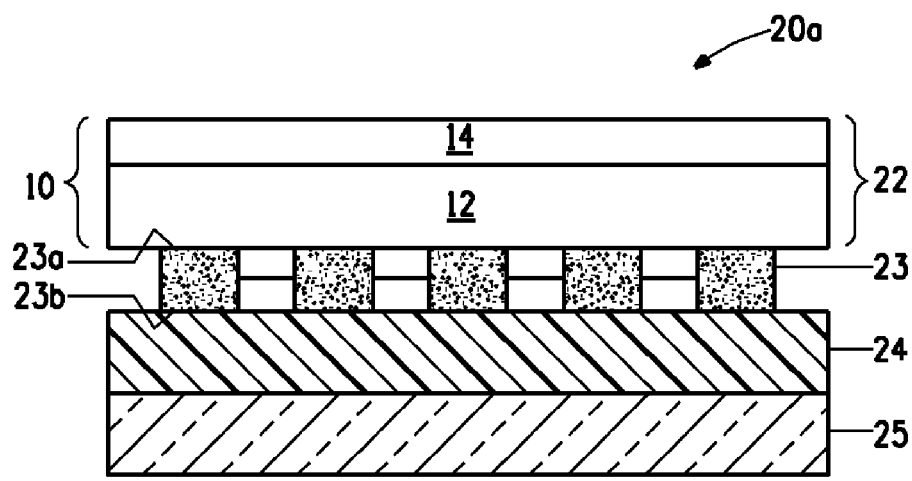
FIG. 3 is a cross-sectional view of one particular embodiment of the present invention, wherein solar cell module 20a comprises one layer of the preformed bi-layer sheet 10 in which the first sub-layer 12 is in direct contact with the light-receiving side 23a of solar cell layer 23. In this embodiment, the preformed bi-layer sheet 10 may serve as both a front-sheet encapsulant layer 22 and an incident layer 21.
Figure 4:
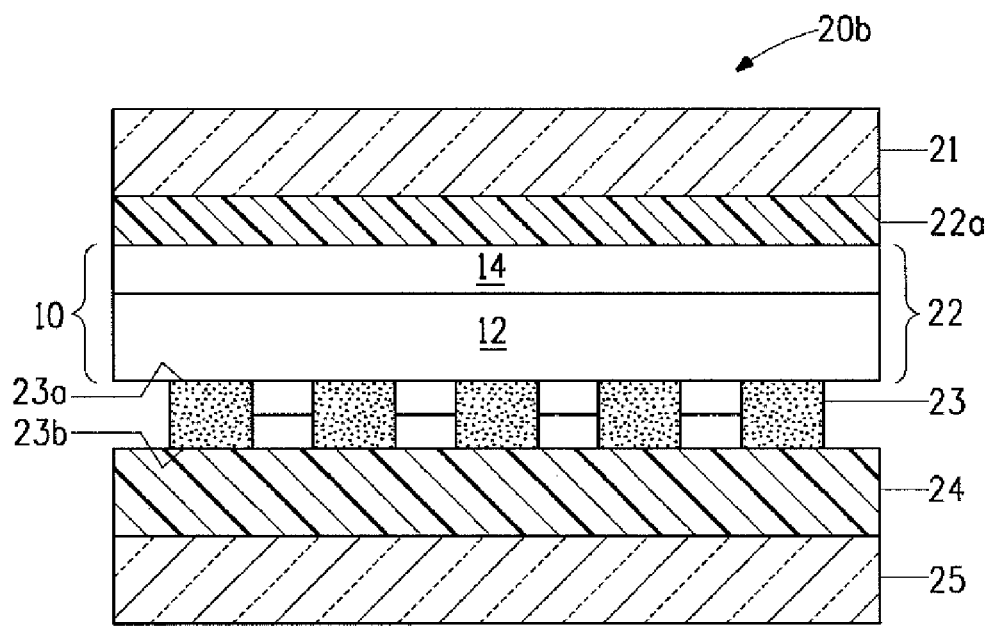
FIG. 4 is a cross-sectional view of another embodiment of the present invention, wherein, compare to solar cell laminate 20a in FIG. 3, laminate 20b further comprises an incident layer 21 laminated next to a second front-sheet encapsulant layer 22a, which in turn is laminated next to the second sub-layer 14 of the preformed bi-layer sheet 10.

In one particular embodiment (as shown in FIG. 3), the preformed bi-layer sheet 10 is included in solar cell laminate 20a as a front-sheet encapsulant layer 22 having the poly(vinyl butyral) sub-layer 12 in direct contact with and adhered to solar cell layer 23 at the light-receiving side 23a. The solar cell laminate 20a may further comprise at least one back-sheet encapsulant layer 24 and a back sheet 25. In this particular embodiment, the preformed bi-layer sheet 10 may function as both a front-sheet encapsulant layer 22 and an incident layer 21. Or, as shown in FIG. 4, besides the preformed bi-layer sheet 10, the solar cell layer 23, the back-sheet encapsulant layer 24, and the back-sheet 25, solar cell laminate 20b further comprises an incident layer 21 and at least one additional front-sheet encapsulant layer 22a. In this particular embodiment, the preformed bi-layer sheet 10 serves as a front-sheet encapsulant layer and due to the lack of adhesion between the film sub-layer 14 and the incident layer 21, the at least one additional front-sheet encapsulant layer 22a is incorporated between the preformed bi-layer sheet 10 and the incident layer 21 to form a bond between the two layers.

Figure 5:
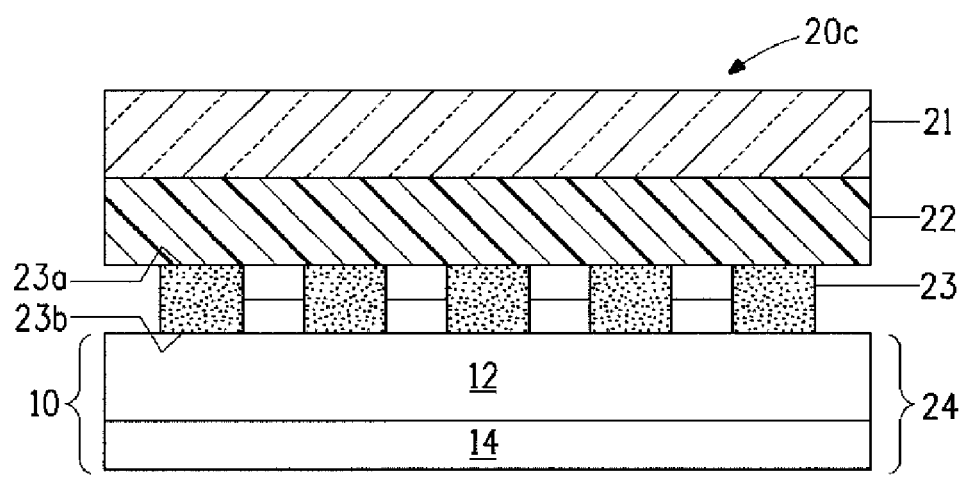
FIG. 5 is a cross-sectional view of yet another embodiment of the present invention, wherein solar cell module 20c comprises one layer of the preformed bi-layer sheet 10 in which the first sub-layer 12 is in direct contact with the back side 23b of solar cell layer 23. In this embodiment, the preformed bi-layer sheet 10 may serve as both a back-sheet encapsulant layer 24 and a back-sheet 25.
Figure 6:
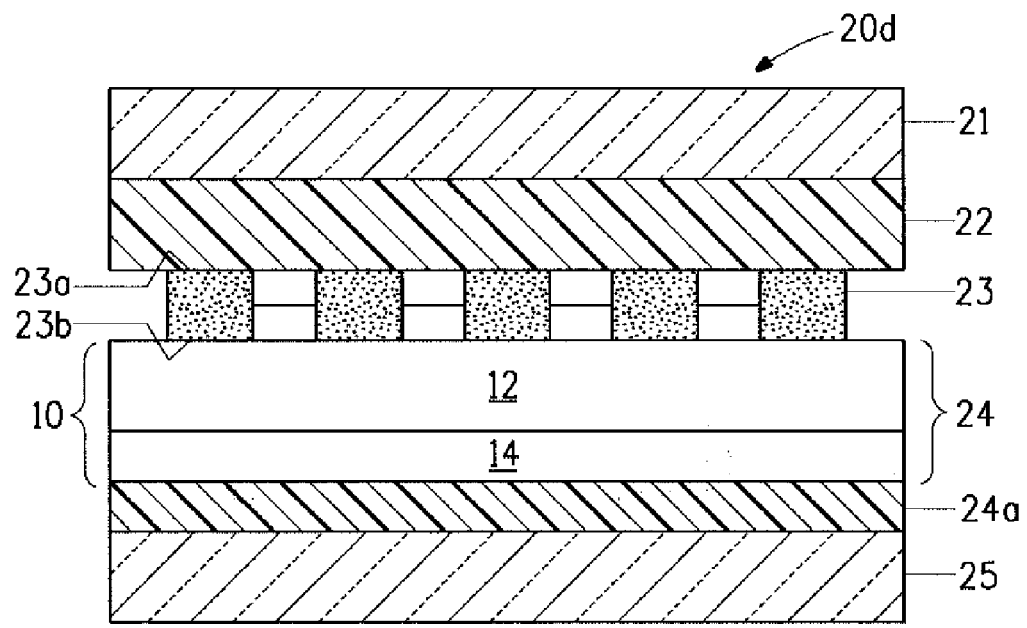
FIG. 6 is a cross-sectional view of yet another embodiment of the present invention, wherein, compare to solar cell laminate 20c in FIG. 5, laminate 20d further comprises a back-sheet 25 laminated next to a second back-sheet encapsulant layer 24a, which in turn is laminated next to the second sub-layer 14 of the preformed bi-layer sheet 10.

In another particular embodiment (as shown in FIG. 5), the preformed bi-layer sheet 10 is included in solar cell laminate 20c as a back-sheet encapsulant layer 24 having the poly(vinyl butyral) sub-layer 12 in direct contact with and adhered to solar cell layer 23 at the back side 23b. The solar cell laminate 20c may further comprise a front-sheet encapsulant layer 22 and an incident layer 21. In this particular embodiment, the preformed bi-layer sheet 10 may function as both a back-sheet encapsulant layer 24 and a back-sheet 25. Or, as shown in FIG. 6, besides the incident layer 21, the at least one front-sheet encapsulant layer 22, the solar cell layer 23, the preformed bi-layer sheet 10, solar cell laminate 20d may further comprise a back-sheet 25 and at least one additional back-sheet encapsulant layer 24a. In this particular embodiment, the preformed bi-layer sheet 10 serves as a back-sheet encapsulant layer 24 and due to the lack of adhesion between the film sub-layer 14 and the back-sheet 25, the at least one additional back-sheet encapsulant layer 24a is incorporated between the preformed bi-layer sheet 10 and the back-sheet 25 to form a bond between the two layers.

Figure 7:
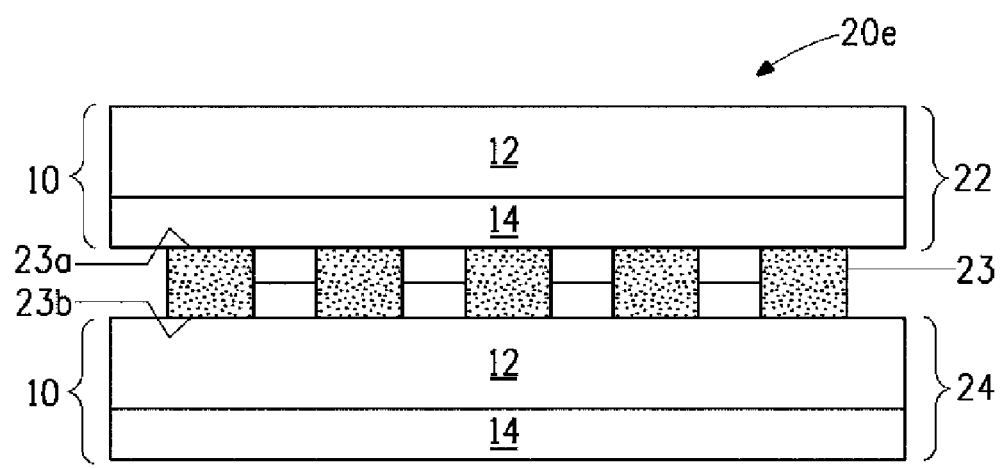
FIG. 7 is a cross sectional view of yet another embodiment of the present invention, wherein the solar cell module 20e comprises a first preformed bi-layer sheet 10 having its first sub-layer 12 in direct contact with the light-receiving side 23a of solar cell layer 23 and a second preformed bi-layer sheet 10 having its first sub-layer 12 in direct contact with the back side 23b of solar cell layer 23. In this embodiment, the first preformed bi-layer sheet 10 may serve as both a front-sheet encapsulant layer 22 and an incident layer 21, and the second preformed bi-layer sheet 10 may serve as both a back-sheet encapsulant layer 24 and a back-sheet 25.

In yet another particular embodiment (as shown in FIG. 7), solar cell laminate 20e may comprise two (2) layers of the preformed bi-layer sheet 10. In this particular embodiment, the two preformed bi-layer sheets 10 are laminated to each side of solar cell layer 23 with their poly(vinyl butyral) sub-layers in a closer proximity to the solar cell 23. Optionally, an incident layer and/or a back-sheet layer and/or additional encapsulant layer(s) may also be included in solar cell laminate 20e.

In another aspect, the solar cell laminate of the present invention comprises at least one layer of the preformed bi-layer sheet 10 which has the film sub-layer 14 in a closer proximity to the solar cell layer. In such cases, due to the lack of adhesion between the film sub-layer 14 and the solar cell layer, at least one additional encapsulant layer is placed between the preformed bi-layer sheet 10 and the solar cell layer 23 to form a bond between the two.

Figure 8:
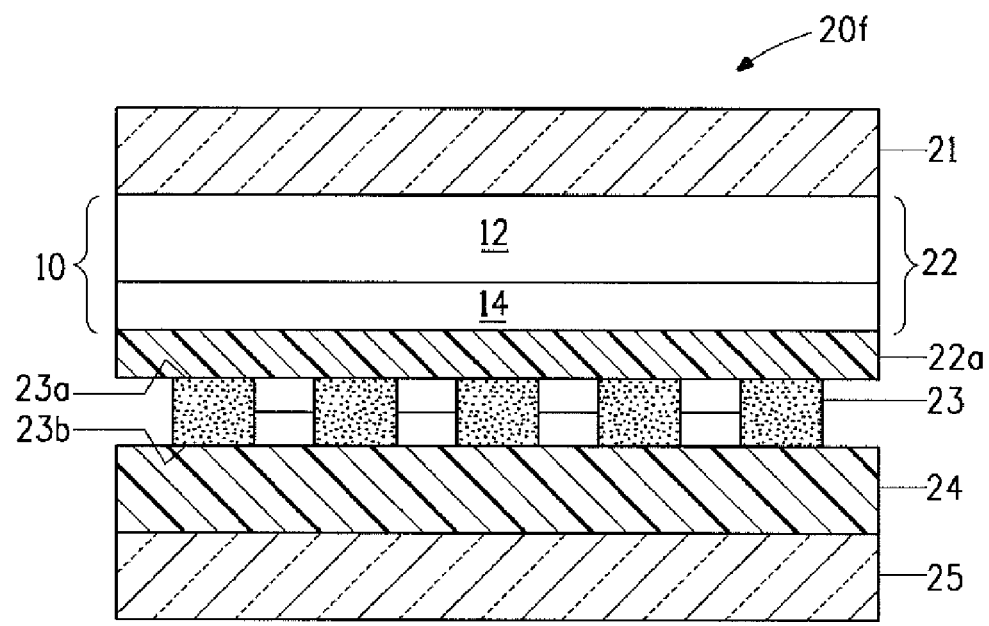
FIG. 8 is a cross sectional view of yet another embodiment of the present invention, wherein solar cell module 20f comprises one layer of the preformed bi-layer sheet 10 in which the second sub-layer 14 is in a closer proximity to the light-receiving side 23a of solar cell layer 23. In addition, solar cell module 20f further comprises a second front-sheet encapsulant layer 22a which is placed in between the preformed bi-layer sheet 10 and an incident layer 21.

In one particular embodiment, as shown in FIG. 8, the at least one preformed bi-layer sheet 10 is included in solar cell laminate 20f as a front-sheet encapsulant layers 22 with its film sub-layer 14 in a closer proximity to solar cell layer 23 at the light-receiving side 23a. In addition, an additional front-sheet encapsulant layer 22a is placed between the preformed bi-layer sheet 10 and the solar cell layer 23 to form a bond between the two. In this particular embodiment, solar cell laminate 20f may further comprise an incident layer 21 laminated to the poly(vinyl butyral) sub-layer 12 of the preformed bi-layer sheet 10, a back-sheet encapsulant layer 24, and a back-sheet 25.

Figure 9:
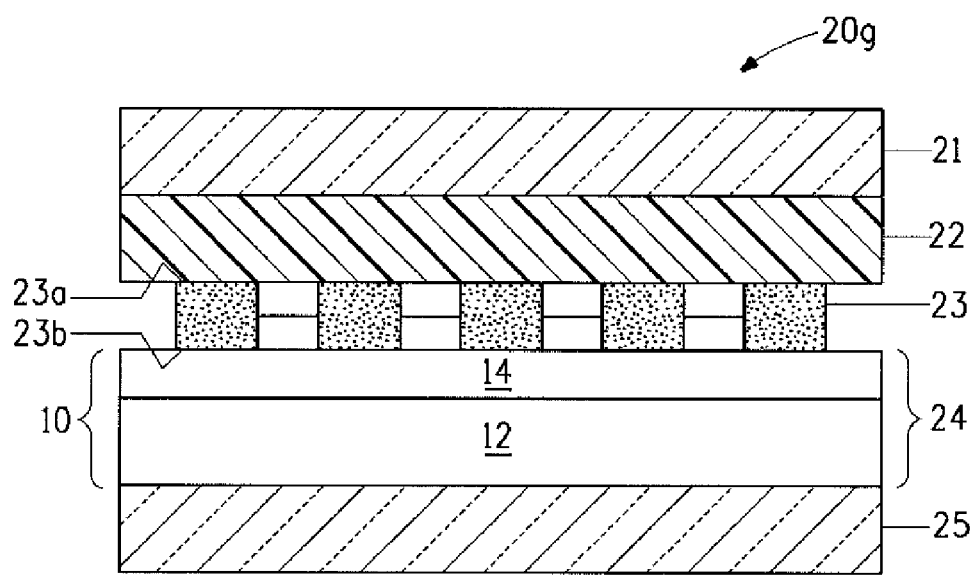
FIG. 9 is a cross sectional view of yet another embodiment of the present invention, wherein solar cell module 20g comprises one layer of the preformed bi-layer sheet 10 in which the second sub-layer 14 is in a closer proximity to the back side 23b of solar cell layer 23. In addition, solar cell module 20g further comprises second back-sheet encapsulant layer 24a which is placed in between the preformed bi-layer sheet 10 and a back-sheet 25.

In another embodiment, as shown in FIG. 9, the at least one preformed bi-layer sheet 10 is included in solar cell laminate 20g as a back-sheet encapsulant layer 24 with its film sub-layer 14 in a closer proximity to solar cell layer 23 at the back side 23b. In addition, an additional back-sheet encapsulant layer 24a is placed between the preformed bi-layer sheet 10 and the solar cell layer 23 to form a bond between the two. In this particular embodiment, solar cell laminate 20g may further comprise a back-sheet 25 laminated to the poly(vinyl butyral) sub-layer 12 of the preformed bi-layer sheet 10, a front-sheet encapsulant layer 22, and an incident layer 21.

It is understood that these particular embodiments described above or illustrated in the figures may further comprise other additional layers of sheets or films. In addition, the scope of the present invention should not be limited to these particular embodiments. Basically, any solar cell laminate or module comprising at least one layer of the preformed bi-layer sheet 10, as disclosed herein, is within the scope of the present invention.

Also in accordance to the present invention, if greater adhesion is desired, one or both surfaces of any of the composite layers of the solar cell laminate of the present invention may be treated to enhance the adhesion to other laminate layers. This treatment may take any form known within the art, including adhesives, primers, such as silanes, flame treatments, such as disclosed within U.S. Pat. Nos. 2,632,921; 2,648,097; 2,683,894; and 2,704,382, plasma treatments, such as disclosed within U.S. Pat. No. 4,732,814, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the polymeric film through vacuum sputtering as disclosed in U.S. Pat. No. 4,865,711. Or, as disclosed in U.S. Pat. No. 5,415,942, a hydroxy-acrylic hydrosol primer coating that may serve as an adhesion-promoting primer for poly(ethylene terephthalate) films.

In a particular embodiment, the adhesive layer may take the form of a coating. The thickness of the adhesive/primer coating may be less than 1 mil, or preferably, less than 0.5 mil, or more preferably, less than 0.1 mil. The adhesive may be any adhesive or primer known within the art. Specific examples of adhesives and primers which may be useful in the present invention include, but are not limited to, gamma-chloropropylmethoxysilane, vinyltrichlorosilane, vinyltriethoxysilane, vinyltris(beta-methoxyethoxy)silane, gamma-methacryloxypropyltrimethoxysilane, beta-(3,4-epoxycyclohexyl)ethyltrimethoxysilane, gammaglycidoxypropyltrimethoxysilane, vinyl-triacetoxysilane, gamma-mercaptopropyltrimethoxysilane, gamma-aminopropyltriethoxysilane, N-beta-(aminoethyl)-gamma-aminopropyl-trimethoxysilane, glue, gelatine, caesin, starch, cellulose esters, aliphatic polyesters, poly(alkanoates), aliphatic-aromatic polyesters, sulfonated aliphatic-aromatic polyesters, polyamide esters, rosin/polycaprolactone triblock copolymers, rosin/poly(ethylene adipate) triblock copolymers, rosin/poly(ethylene succinate) triblock copolymers, poly(vinyl acetates), poly(ethylene-co-vinyl acetate), poly(ethylene-co-ethyl acrylate), poly(ethylene-co-methyl acrylate), poly(ethylene-co-propylene), poly(ethylene-co-1-butene), poly(ethylene-co-1-pentene), poly(styrene), acrylics, polyurethanes, sulfonated polyester urethane dispersions, nonsulfonated urethane dispersions, urethane-styrene polymer dispersions, non-ionic polyester urethane dispersions, acrylic dispersions, silanated anionic acrylate-styrene polymer dispersions, anionic acrylate-styrene dispersions, anionic acrylate-styrene-acrylonitrile dispersions, acrylate-acrylonitrile dispersions, vinyl chloride-ethylene emulsions, vinylpyrrolidone/styrene copolymer emulsions, carboxylated and noncarboxylated vinyl acetate ethylene dispersions, vinyl acetate homopolymer dispersions, polyvinyl chloride emulsions, polyvinylidene fluoride dispersions, ethylene acrylic acid dispersions, polyamide dispersions, anionic carboxylated or noncarboxylated acrylonitrile-butadiene-styrene emulsions and acrylonitrile emulsions, resin dispersions derived from styrene, resin dispersions derived from aliphatic and/or aromatic hydrocarbons, styrene-maleic anhydrides, and the like and mixtures thereof.

In another particular embodiment, the adhesive or primer is a silane that incorporates an amine function. Specific examples of such materials include, but are not limited to, gamma-aminopropyltriethoxysilane, N-beta-(aminoethyl)-gamma-aminopropyl-trimethoxysilane, and the like and mixtures thereof. Commercial examples of such materials include, for example A-1100® silane, (from the Silquest Company, formerly from the Union Carbide Company, believed to be gamma-aminopropyltrimethoxysilane) and Z6020® silane, (from the Dow Corning Corp.).

The adhesives may be applied through melt processes or through solution, emulsion, dispersion, and the like, coating processes. One of ordinary skill in the art will be able to identify appropriate process parameters based on the composition and process used for the coating formation. The above process conditions and parameters for making coatings by any method in the art are easily determined by a skilled artisan for any given composition and desired application. For example, the adhesive or primer composition can be cast, sprayed, air knifed, brushed, rolled, poured or printed or the like onto the surface. Generally the adhesive or primer is diluted into a liquid medium prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. Such processes are disclosed within the art for wax coatings in, for example, U.S. Pat. Nos. 5,078,313; 5,281,446; and 5,456,754.

Notably, specific solar cell laminate constructions (top (light incident) side to back side) include, but are not limited to, [film/PVB]/solar cell/[PVB/film]; glass/other encapsulant layer/solar cell/[PVB/film]; Tedlar® film/other encapsulant layer/solar cell/[PVB/film]; [film/PVB]/solar cell/other encapsulant layer/glass; [film/PVB]/solar cell/other encapsulant layer/Tedlar® film; [film/PVB]/solar cell/other encapsulant layer/PET film; [film/PVB]/solar cell/other encapsulant layer/aluminum stock; [film/PVB]/solar cell/other encapsulant layer/galvanized steel sheet; [film/PVB]/[film/PVB]/solar cell/[PVB/film]; [film/PVB]/[film/PVB]/solar cell/[PVB/film]/[PVB/film]; glass/other encapsulant layer/solar cell/[PVB/film]/[PVB/film]; glass/[PVB/film]/other encapsulant layer/solar cell/[PVB/film]; glass/other encapsulant layer/[film/PVB]/solar cell/[PVB/film]; [film/PVB]/solar cell/[PVB/film]/other encapsulant layer/aluminum stock; [film/PVB]/solar cell/other encapsulant layer/[film/PVB]/aluminum stock; [film/PVB]/solar cell/[PVB/film]/other encapsulant layer/galvanized steel sheet; [film/PVB]/solar cell/other encapsulant layer/[film/PVB]/galvanized steel sheet; glass/other encapsulant layer/solar cell/[PVB/film]/other encapsulant layer/aluminum stock; glass/other encapsulant layer/solar cell/other encapsulant layer/[film/PVB]/aluminum stock; glass/other encapsulant layer/solar cell/[PVB/film]/other encapsulant layer/galvanized steel sheet; glass/other encapsulant layer/solar cell/other encapsulant layer/[film/PVB]/galvanized steel sheet, wherein "film/PVB" or "PVB/film" are used herein to denote the preformed bi-layer sheet 10.

The use of the poly(vinyl butyral) containing preformed bi-layer sheets in solar cell laminates has been proven to be more beneficial than using a poly(vinyl butyral) sheet directly in solar cell laminates. First, the film sub-layer of the preformed bi-layer sheet helps to reduce or eliminate the tendency of the poly(vinyl butyral) sheet to block or stick together within the roll during storage or shipment under ambient conditions. This is accomplished by not allowing the poly(vinyl butyral) surfaces to come in contact with each other, and, in turn, to stick or block together. In addition, due to the reduction or elimination of the layer blocking tendency, the two step lamination process that is required when laminating a poly(vinyl butyral) sheet directly to other films or sheets has become unnecessary and thereby greatly simplifying the lamination process. Moreover, as discussed above, during the conventional process, when poly(vinyl butyral) sheets are used as laminate layers, interleave layers, e.g., PET film layers, are often used during the lamination process and then discarded as undesirable waste. In the present invention, however, the film sub-layer of the preformed bi-layer sheet serves as an interleave layer to the poly(vinyl butyral) sheet, and, instead of being discarded, the film sub-layer remains in the laminate providing additional function(s).

Manufacture of Solar Cell Module or Laminate

In a further embodiment, the present invention is a simplified process of manufacturing a solar cell laminate comprising a preformed poly(vinyl butyral) containing bi-layer sheet disclosed herein.

Specifically, unlike those solar cell laminates containing poly(vinyl butyral) sheets, the preformed bi-layer sheets disclosed herein can be simply laid up with other laminate layers and subject to further lamination process, as described below.

The solar cell laminates of the present invention may be produced through autoclave and non-autoclave processes, as described below. For example, the solar cell constructs described above may be laid up in a vacuum lamination press and laminated together under vacuum with heat and standard atmospheric or elevated pressure.

In an exemplary process, a glass sheet, a front-sheet encapsulant layer, a solar cell, a back-sheet encapsulant layer and Tedlar® film, and a cover glass sheet are laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 120° C. to about 180° C., at a pressure of about 200 psi (about 15 bars), for from about 10 to about 50 minutes. Preferably the bag is autoclaved at a temperature of from about 120° C. to about 160° C. for 20 minutes to about 45 minutes. More preferably the bag is autoclaved at a temperature of from about 135° C. to about 160° C. for about 20 minutes to about 40 minutes. A vacuum ring may be substituted for the vacuum bag. One type of vacuum bag is disclosed within U.S. Pat. No. 3,311,517.

Any air trapped within the laminate assembly may be removed through a nip roll process. For example, the laminate assembly may be heated in an oven at a temperature of about 80° C. to about 120° C., or preferably, at a temperature of between about 90° C. and about 100° C., for about 30 minutes. Thereafter, the heated laminate assembly is passed through a set of nip rolls so that the air in the void spaces between the solar cell outside layers, the solar cell and the encapsulant layers may be squeezed out, and the edge of the assembly sealed. This process may provide the final solar cell laminate or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and pressure to between about 100 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the solar cell laminates are removed from the autoclave. This should not be considered limiting. Essentially any lamination process known within the art may be used with the encapsulants of the present invention.

The laminates of the present invention may also be produced through non-autoclave processes. Such non-autoclave processes are disclosed, for example, within U.S. Pat. Nos. 3,234,062; 3,852,136; 4,341,576; 4,385,951; 4,398,979; 5,536,347; 5,853,516; 6,342,116; and 5,415,909, US Patent Application No. 2004/0182493, European Patent No. EP 1 235 683 B1, and PCT Patent Application Nos. WO 91/01880 and WO 03/057478 A1. Generally, the non-autoclave processes include heating the laminate assembly or the pre-press assembly and the application of vacuum, pressure or both. For example, the pre-press may be successively passed through heating ovens and nip rolls.

If desired, the edges of the solar cell laminate may be sealed to reduce moisture and air intrusion and their potentially degradation effect on the efficiency and lifetime of the solar cell by any means disclosed within the art. General art edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples are intended to be illustrative of the present invention, and are not intended in any way to limit the scope of the present invention. The solar cell interconnections are omitted from the examples below to clarify the structures, but any common art solar cell interconnections may be utilized within the present invention.

Methods

The following methods are used in the Examples presented hereafter.

I. Lamination Process 1:

The laminate layers described below are stacked (laid up) to form the pre-laminate structures described within the examples. For the laminate containing a film layer as the incident or back-sheet layer, a cover glass sheet is placed over the film layer. The pre-laminate structure is then placed within a vacuum bag, the vacuum bag is sealed and a vacuum is applied to remove the air from the vacuum bag. The bag is placed into an oven and while maintaining the application of the vacuum to the vacuum bag, the vacuum bag is heated at 135° C. for 30 minutes. The vacuum bag is then removed from the oven and allowed to cool to room temperature (25±5° C.). The laminate is then removed from the vacuum bag after the vacuum is discontinued.

II. Lamination Process 2:

The laminate layers described below are stacked (laid up) to form the pre-laminate structures described within the examples. For the laminate containing a film layer as the incident or back-sheet layer, a cover glass sheet is placed over the film layer. The pre-laminate structure is then placed within a vacuum bag, the vacuum bag is sealed and a vacuum is applied to remove the air from the vacuum bag. The bag is placed into an oven and heated to 90-100° C. for 30 minutes to remove any air contained between the assembly. The pre-press assembly is then subjected to autoclaving at 135° C. for 30 minutes in an air autoclave to a pressure of 200 psig (14.3 bar), as described above. The air is then cooled while no more air is added to the autoclave. After 20 minutes of cooling when the air temperature reaches less than about 50° C., the excess pressure is vented, and the laminate is removed from the autoclave.

Examples 1-14

The 12-inch by 12-inch solar cell laminate structures described below in Table 1 are assembled and laminated by Lamination Process 1. In each construct, the layers are described in the order of from top to bottom and the poly (vinyl butyral) sub-layer of the preformed bi-layer sheet is in direct contact with the solar cell surface.

TABLE 1

Solar Cell Laminate Structures

| Example | Layer 1 | Layer 2 | Layer 3 | Layer 4 | Layer 5 |
|---|---|---|---|---|---|
| 1, 15 | Glass 1 | PVB | Solar Cell 1 | Bilayer 1 | |
| 2, 16 | FPF | EBA | Solar Cell 2 | Bilayer 2 | |
| 3, 17 | Bilayer 3 | Solar Cell 3 | Bilayer 2 | | |

TABLE 1-continued

Solar Cell Laminate Structures

| Example | Layer 1 | Layer 2 | Layer 3 | Layer 4 | Layer 5 |
|---|---|---|---|---|---|
| 4, 18 | Glass 2 | Ionomer 1 | Solar Cell 4 | Bilayer 1 | |
| 5, 19 | FPF | EMA | Solar Cell 1 | Bilayer 2 | |
| 6, 20 | Bilayer 3 | Solar Cell 1 | ACR | AL | |
| 7, 21 | Glass 3 | EVA | Solar Cell 4 | Bilayer 2 | |
| 8, 22 | Bilayer 3 | Solar Cell 1 | PVB A | AL | |
| 9, 23 | Glass 1 | Ionomer 2 | Solar Cell 4 | Bilayer 2 | |
| 10, 24 | Glass 2 | PVB | Bilayer 2 | Solar Cell 1 | Bilayer 2 |
| 11, 25 | Bilayer 3 | Solar Cell 4 | Bilayer 2 | ACR | AL |
| 12, 26 | Bilayer 3 | Solar Cell 1 | Bilayer 3 | | |
| 13, 27 | Bilayer 3 | Solar Cell 2 | Ionomer 1 | Glass 1 | |
| 14, 28 | Bilayer 3 | Solar Cell 3 | PVB A | Glass 2 | |

ACR is a 20 mil (0.51 mm) thick embossed sheet of a poly(ethylene-co-methacrylic acid) containing 15 wt % of polymerized residues of methacrylic acid and having a MI of 5.0 g/10 minutes (190° C., ISO 1133, ASTM D1238).
AL is an aluminum sheet (3.2 mm thick) and is 5052 alloyed with 2.5 wt % of magnesium and conforms to Federal specification QQ-A-250/8 and ASTM B209.
Bilayer 1 is SentryGlas ® Spallshield 3010, a product of DuPont.
Bilayer 2 is SentryGlas ® Spallshield 1510, a product of DuPont.
Bilayer 3 is a bi-laminate of a corona surface treated Tedlar ® film grade WH15BL3 (1.5 mil (0.038 mm) thick), a product of DuPont, and a 20 mil (0.51 mm) thick plasticized poly(vinyl butyral) sheet.
EBA is a formulated composition based on poly(ethylene-co-butyl acrylate) containing 20 wt % of polymerized residues of butyl acrylate based on the total weight of the copolymer and in the form of a 20 mil (0.51 mm) thick sheet.
EMA is a formulated composition based on poly(ethylene-co-methyl acrylate) containing 20 wt % of polymerized residues of methyl acrylate based on the total weight of the copolymer and in the form of a 20 mil (0.51 mm) thick sheet.
EVA is SC50B, believed to be a formulated composition based on poly(ethylene-co-vinyl acetate) in the form of a 20 mil (0.51 mm) thick sheet (a product of the Hi-Sheet Corporation, formerly Mitsui Chemicals Fabro, Inc.).
FPF is a corona surface treated Tedlar ® film grade WH15BL3 (1.5 mil (0.038 mm) thick), a product of DuPont.
Glass 1 is Starphire ® glass from the PPG Corporation.
Glass 2 is a clear annealed float glass plate layer (2.5 mm thick).
Glass 3 in a Solex ® solar control glass (3.0 mm thick).
Ionomer 1 is a 90 mil (2.25 mm) thick embossed sheet of a poly(ethylene-co-methacrylic acid) containing 18 wt % of polymerized residues of methacrylic acid that is 30% neutralized with zinc ion and having a MI of 1 g/10 minutes (190° C., ISO 1133, ASTM D1238). Ionomer 1 is prepared from a poly(ethylene-co-methacrylic acid) having a MI of 60 g/10 minutes.
Ionomer 2 is a 20 mil (0.51 mm) thick embossed sheet of a poly(ethylene-co-methacrylic acid) containing 22 wt % of polymerized residues of methacrylic acid that is 26% neutralized with zinc ion and having a MI of 0.75 g/10 minutes (190° C., ISO 1133, ASTM D1238). Ionomer 2 is prepared from a poly(ethylene-co-methacrylic acid) having a MI of 60 g/10 minutes.
PVB is B51V, believed to be a formulated composition based on poly(vinyl butyral) in the form of a 20 mil (0.51 mm) thick sheet (a product of DuPont).
PVB A is an acoustic poly(vinyl butyral) sheet including 100 parts per hundred (pph) poly(vinyl butyral) with a hydroxyl number of 15 plasticized with 48.5 pph plasticizer tetraethylene glycol diheptanoate prepared similarly to disclosed within PCT Patent Application No. WO 2004/039581.
Solar Cell 1 is a 10-inch by 10-inch amorphous silicon photovoltaic device comprising a stainless steel substrate (125 micrometers thick) with an amorphous silicon semiconductor layer (U.S. Pat. No. 6,093,581, Example 1).
Solar Cell 2 is a 10-inch by 10-inch copper indium diselenide (CIS) photovoltaic device (U.S. Pat. No. 6,353,042, column 6, line 19).
Solar Cell 3 is a 10-inch by 10-inch cadmium telluride (CdTe) photovoltaic device (U.S. Pat. No. 6,353,042, column 6, line 49).
Solar Cell 4 is a silicon solar cell made from a 10-inch by 10-inch polycrystalline EFG-grown wafer (U.S. Pat. No. 6,660,930, column 7, line 61).

Examples 15-28

The 12-inch by 12-inch solar cell laminate structures described above in Table 1 are assembled and laminated by Lamination Process 2. In each construct, the layers are described in the order of from top to bottom and the poly(vinyl butyral) sub-layer of the preformed bi-layer sheet is in direct contact with the solar cell surface.

What is claimed is:

1. A process of manufacturing a solar cell laminate comprising: (i) providing an assembly comprising, from top to bottom, a front-sheet encapsulant layer, a solar cell layer comprising one or a plurality of electronically interconnected solar cells, and a back-sheet encapsulant layer, and (ii) laminating the assembly to form the solar cell module, wherein at least one of the two encapsulant layers is formed of a preformed bi-layer sheet consisting essentially of a first sub-layer of a poly(vinyl butyral) sheet and (B) a second sub-layer of a metal or polymeric film.

2. The process of claim 1, wherein said second sub-layer is said polymeric film and said polymeric film comprises a polymeric composition selected from the group consisting of poly(ethylene terephthalate), polycarbonate, polypropylene, polyethylene, polypropylene, cyclic polyolefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, and ethylene-tetrafluoroethylene copolymers.

3. The process of claim 1, wherein said one or a plurality of solar cells are selected from the group consisting of multicrystalline solar cells, thin film solar cells, compound semiconductor solar cells, and amorphous silicon solar cells.

4. The process of claim 1, wherein said front-sheet encapsulant layer is formed of said preformed bi-layer sheet with its first sub-layer in direct contact with said solar cell layer and wherein the second sub-layer is the polymeric film, and wherein said assembly in step (i) further comprises a back-sheet placed next to said back-sheet encapsulant layer opposite from said solar cell layer.

5. The process of claim 1, wherein said back-sheet encapsulant layer is formed of said preformed bi-layer sheet with its first sub-layer in direct contact with said solar cell layer, and wherein said assembly in step (i) further comprises an incident layer placed next to said front-sheet encapsulant layer opposite from said solar cell layer.

6. The process of claim 1, wherein said front-sheet encapsulant layer is formed of said preformed bi-layer sheet with its second sub-layer in a closer proximity to said solar cell layer and wherein the second sub-layer is the polymeric film; wherein said assembly in step (i) further comprises an incident layer, a second front-sheet encapsulant layer, and a back-sheet; wherein said incident layer is placed next to the first sub-layer of said preformed bi-layer sheet, which in turn has its second sub-layer in direct contact with said second front-sheet encapsulant layer, and which in turn is in direct contact with said solar cell layer; and wherein said back-sheet is placed next to said back-sheet encapsulant layer opposite from said solar cell layer.

7. The process of claim 1, wherein said back-sheet encapsulant layer is formed of said preformed bi-layer sheet with its second sub-layer in a closer proximity to said solar cell layer; wherein said assembly in step (i) further comprises an incident layer, a second back-sheet encapsulant layer, and a back-sheet; wherein said incident layer is placed next to said front-sheet encapsulant layer opposite from said solar cell layer; and wherein said back-sheet is placed next to the first sub-layer of said preformed bi-layer sheet, which in turn has its second sub-layer in direct contact with said second back-sheet encapsulant layer, and which in turn is in direct contact with said solar cell layer.

8. The process of claim 1, wherein the step (ii) of lamination is conducted by subjecting the assembly to heat.

9. The process of claim 1, wherein the second sub-layer is a polymeric film selected from the group consisting of bi-axially oriented poly(ethylene terephthalate) films, coated bi-axially oriented poly(ethylene terephthalate) films, and fluoropolymer films.

10. The process solar cell laminate of claim 4, wherein said back-sheet encapsulant layer comprises a polymeric composition selected from the group consisting of poly(vinyl butyral), ionomers, ethylene vinyl acetate, acoustic poly(vinyl acetal), acoustic poly(vinyl butyral), thermoplastic polyurethane, polyvinylchloride, metallocene-catalyzed linear low density polyethylenes, polyolefin block elastomers, ethylene acrylate ester copolymers, acid copolymers, silicone elastomers and epoxy resins, and wherein the first sub-layer of said at least one preformed bi-layer sheet is in direct contact with and adhered to said solar cell layer.

11. The process of claim 4, wherein said assembly in step (i) further comprises a second front-sheet encapsulant layer and an incident layer, wherein said incident layer is placed next to said second front-sheet encapsulant layer, which in turn is in direct contact with the second sub-layer of said preformed bi-layer sheet.

12. The process of claim 4, wherein said second sub-layer is said polymeric film and said polymeric film comprises a polymeric composition selected from the group consisting of poly(ethylene terephthalate), polycarbonate, polypropylene, polyethylene, polypropylene, cyclic polyolefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, and ethylene-tetrafluoroethylene copolymers.

13. The process of claim 5, wherein said second sub-layer is said metal film and said metal film is an aluminum foil.

14. The process of claim 5, wherein said front-sheet encapsulant layer comprises a polymeric composition selected from the group consisting of poly(vinyl butyral), ionomers, ethylene vinyl acetate, acoustic poly(vinyl acetal), acoustic poly(vinyl butyral), thermoplastic polyurethane, polyvinylchloride, metallocene-catalyzed linear low density polyethylenes, polyolefin block elastomers, ethylene acrylate ester copolymers, acid copolymers, silicone elastomers and epoxy resins, and wherein the first sub-layer of said at least one preformed bi-layer sheet is in direct contact with and adhered to said solar cell layer.

15. The process of claim 5, wherein said assembly in step (i) further comprises a second back-sheet encapsulant layer and a back-sheet, wherein said back-sheet is placed next to said second back-sheet encapsulant layer, which in turn is in direct contact with the second sub-layer of said preformed bi-layer sheet.

16. The process of claim 5, wherein said second sub-layer is said metal film and said metal film is an aluminum foil.

17. The process of claim 6, wherein said second sub-layer is said polymeric film and said polymeric film comprises a polymeric composition selected from the group consisting of poly(ethylene terephthalate), polycarbonate, polypropylene, polyethylene, polypropylene, cyclic polyolefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, and ethylene-tetrafluoroethylene copolymers.

18. The process of claim 7, wherein said second sub-layer is said polymeric film and said polymeric film comprises a polymeric composition selected from the group consisting of poly(ethylene terephthalate), polycarbonate, polypropylene, polyethylene, polypropylene, cyclic polyolefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, and ethylene-tetrafluoroethylene copolymers.

19. The process of claim 7, wherein said second sub-layer is said metal film and said metal film is an aluminum foil.

20. The process of claim 8, wherein the step (ii) of lamination further comprises subjecting the assembly to pressure.

21. The process of claim 8, wherein the step (ii) of lamination further comprises subjecting the assembly to vacuum.

22. The process of claim 9, wherein second sub-layer is a polymer film selected from group consisting of the bi-axially oriented poly(ethylene terephthalate) films.

23. The process of claim 9, wherein second sub-layer is a polymer film selected from group consisting of the coated bi-axially oriented poly(ethylene terephthalate) films.

24. The process of claim 9, wherein second sub-layer is a polymer film selected from group consisting of the fluoropolymer films.

25. The process of claim 10, wherein said back-sheet encapsulant layer is formed of a second preformed bi-layer sheet.

26. The process of claim 10, wherein the second sub-layer of said at least one preformed bi-layer sheet has at least one side hard coated.

27. The process of claim 10, further comprising an incident layer and a second front-sheet encapsulant layer, wherein said incident layer is bonded to said preformed bi-layer sheet with said second front-sheet encapsulant layer in between.

28. The process of claim 13, wherein said at least one preformed bi-layer sheet is laminated to the back side of said solar cell layer and serves as a back-sheet encapsulant layer.

29. The process of claim 22, wherein said at least one preformed bi-layer sheet is laminated to the back side of said solar cell layer and serves as a back-sheet encapsulant layer.

30. The process of claim 23, wherein said at least one preformed bi-layer sheet is laminated to the back side of said solar cell layer and serves as a back-sheet encapsulant layer.

31. The process of claim 24, wherein said at least one preformed bi-layer sheet is laminated to the back side of said solar cell layer and serves as a back-sheet encapsulant layer.

* * * * *